United States Patent
Steel et al.

(10) Patent No.: US 6,658,265 B1
(45) Date of Patent: Dec. 2, 2003

(54) MATCHING NETWORK FOR A DUAL MODE RF AMPLIFIER

(75) Inventors: Victor E. Steel, Oak Ridge, NC (US); David C. Dening, Stokesdale, NC (US)

(73) Assignee: RF Micro Devices, Inc., Greensboro, NC (US)

(*) Notice: Subject to any disclaimer, the term of this patent is extended or adjusted under 35 U.S.C. 154(b) by 0 days.

(21) Appl. No.: 09/557,547

(22) Filed: Apr. 25, 2000

(51) Int. Cl.$^7$ .............................................. H04M 1/00
(52) U.S. Cl. .................. 455/553.1; 455/115; 455/552.1
(58) Field of Search ........................ 455/91, 115, 127, 455/552, 129, 80, 83, 82, 553, 67.13, 570

(56) References Cited

U.S. PATENT DOCUMENTS

| | | | |
|---|---|---|---|
| 5,060,294 A | 10/1991 | Schwent et al. ............... 455/93 |
| 5,175,871 A | 12/1992 | Kunkel ......................... 455/69 |
| 5,251,331 A | 10/1993 | Schwent et al. ............. 455/127 |
| 5,276,914 A | 1/1994 | Ishizuka et al. .............. 455/83 |
| 5,422,931 A | 6/1995 | Austin-Lazarus et al. ...... 379/59 |
| 5,423,078 A | 6/1995 | Epperson et al. ............. 455/89 |
| 5,432,473 A | 7/1995 | Mattila et al. ............... 330/133 |
| 5,438,684 A | 8/1995 | Schwent et al. ............... 455/89 |
| 5,530,923 A | 6/1996 | Heinonen et al. ............ 455/126 |
| 5,541,554 A * | 7/1996 | Stengel et al. ................. 330/51 |
| 5,673,287 A | 9/1997 | Colvis et al. ................. 375/216 |
| 5,745,857 A * | 4/1998 | Maeng et al. ............. 455/553.1 |
| 5,774,017 A | 6/1998 | Adar ............................. 330/51 |
| 6,043,721 A * | 3/2000 | Nagode et al. .............. 332/117 |
| 6,091,966 A * | 7/2000 | Meadows ................. 455/553.1 |
| 6,137,355 A * | 10/2000 | Sevic et al. .................... 330/51 |
| 6,137,367 A * | 10/2000 | Ezzedine et al. ............ 330/311 |
| 6,188,877 B1 * | 2/2001 | Boesch et al. ................. 455/74 |
| 6,252,871 B1 * | 6/2001 | Posner et al. ................ 370/360 |
| 6,298,244 B1 * | 10/2001 | Boesch et al. ........... 455/553.1 |

* cited by examiner

*Primary Examiner*—William Trost
*Assistant Examiner*—Marcos L Torres
(74) *Attorney, Agent, or Firm*—Withrow & Terranova, PLLC

(57) ABSTRACT

The present invention provides a dual mode amplifier capable of operating in a common (even) mode for one frequency band and a differential (odd) mode for a second frequency band. In the common mode, the amplifier provides two identical signals to a matching network, and in the differential mode, the amplifier provides two signals that are 180° out-of-phase from one another to the matching network. The matching network is configured to maintain the same input and output impedance regardless of whether the amplifier is operating in the common or differential mode. Furthermore, the matching network is preferably configured to terminate second harmonics for each frequency band without affecting the fundamental tone for the other bands, even if the bands are an octave apart. Since the matching network operates on two signals, either common or differential signals, a power combining network is typically required to combine the two signals into a single signal for transmission.

39 Claims, 4 Drawing Sheets

MATCHING NETWORK FOR A DUAL MODE RF AMPLIFIER

BACKGROUND OF THE INVENTION (1) Field of the Invention

The present invention relates to dual mode radio frequency (RF) amplifiers and, in particular, to a unique matching network operable therewith.

(2) Description of the Prior Art

The invention is particularly useful in mobile terminals, such as. personal communication assistants, pagers, head sets, wireless modems, analog and digital cellular telephones, and the like. Since many of these devices are battery-powered, amplifier efficiency is preferably maximized to extend battery life. When amplifiers are designed for their highest efficiency in converting DC energy into RF energy, parasitic losses are minimized, bandwidths are reduced to their bare minimum, harmonics are terminated, and high-Q matching networks are employed. Unfortunately, these design goals are counter to current approaches used to implement wide-band amplifiers or dual-mode amplifiers capable of operating at two different frequencies.

Most RF power amplifiers are designed to operate over a single band of frequencies. In many cases, the bandwidth is less than 5% of the center frequency. If simultaneous coverage over a second band or an extension of the original frequency band is desired, specialized design techniques are required. Wide-band amplifiers are typically created by 1) providing feedback around the power amplifiers, 2) reducing the Q of the matching network, 3) increasing the complexity of the matching network, or 4) employing distributed techniques. Each of these approaches reduces the efficiency of the amplifier by adding losses into the system as part of the trade-off for increased bandwidth. Reducing amplifier efficiency is undesirable, especially in wireless communication applications using battery-powered mobile terminals.

If coverage is desired for an additional frequency band, a dual-band amplifier is typically created. The most straightforward approach is to simply use two amplifiers and switch between the amplifiers to select a desired band for transmission. If a single amplifier configuration is desired, then matching networks that provide the proper impedance transformation for both frequency bands are required. These matching networks are implemented in a number of ways. The use of series and parallel resonant elements (typically inductors and capacitors) in the matching networks are selected such that, at one frequency band, the combination appears inductive and at the other band it appears capacitive. Clever combinations of series and shunt element pairs may allow a creation of networks that deliver the desired properties over multiple frequency bands. These approaches typically result in limited bandwidth for each band and difficulty in tuning and maintaining performance over each of the bands.

If the amplifier is designed to operate in one band at a time, one or more switches are typically used to add or remove elements to or from the matching networks for the appropriate band. This works well and has been employed in many applications. The drawbacks are the additional energy needed to operate the switches and the losses the switches add to the networks. If a change in the amplifier mode is desired, such as changing linearity, efficiency, or power, then the load of the amplifier may be switched by adding or removing elements from the matching network. Examples of these techniques are disclosed in U.S. Pat. Nos. 5,438,684 and 5,673,287 which are assigned to Motorola, Inc. Again, the switching techniques reduce system efficiency, which results in decreased battery life. There is a need for an improved and efficient, dual mode matching network and amplification technique that does not require switches or wide-band tuning of the network.

SUMMARY OF THE INVENTION

The present invention provides a novel solution to the problems discussed above. In particular, the present invention provides a dual mode amplifier capable of operating in a common (even) mode for one frequency band and a differential (odd) mode for a second frequency band. In the common mode, the amplifier provides two identical signals to a matching network, and in the differential mode, the amplifier provides two signals that are 180° out-of-phase from one another to the matching network. The matching network is configured to maintain the same input and output impedance regardless of whether the amplifier is operating in the common or differential mode. Furthermore, the matching network is preferably configured to terminate second harmonics for each frequency band without affecting the fundamental tone for the other bands, even if the bands are an octave apart. Since the matching network operates on two signals, either common or differential signals, a power combining network is typically required to combine the two signals into a single signal for transmission.

Preferably, the amplifier and matching network are configured to operate about the 900 megahertz (MHz) band (roughly 880–920 MHz) for GSM applications and about the 1750 MHz band (roughly 1720–1780 MHz) for DCS applications. These and other aspects of the present invention will become apparent to those skilled in the art after reading the following description of the preferred embodiments when considered with the drawings.

DETAILED DESCRIPTION OF THE PREFERRED EMBODIMENTS

Figure 1:
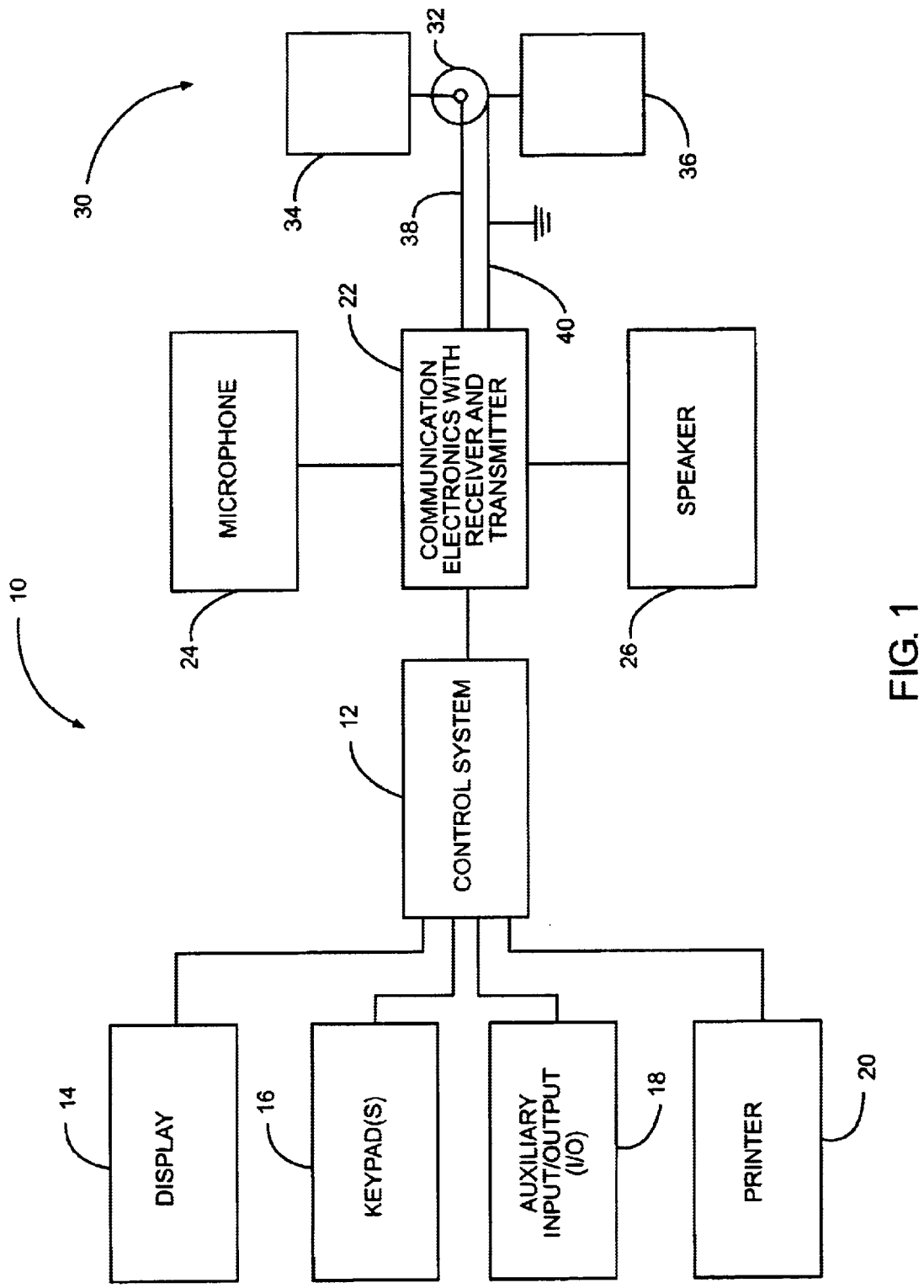
FIG. 1 is a block schematic of a mobile terminal including optional terminal features.

In the following description, like reference characters designate like or corresponding parts throughout the several figures. It should be understood that the illustrations are for the purpose of describing preferred embodiments of the invention and are not intended to limit the invention thereto.

With reference to FIG. 1, a schematic overview of a typical mobile terminal 10 is shown having various optional components. Generally, the terminal 10 will include a control system 12 associated with one or more of the following: a display 14, keypads 16, auxiliary input/out (I/O) device 18, and a printer 20. As noted, each of these components is optional, and various ones or combinations thereof are present in different applications of a mobile terminal. Furthermore, the present invention is not limited to mobile terminal applications, and is equally applicable in various applications requiring amplification of frequencies in multiple bands.

The control system 12 is further associated with the necessary radio communication electronics 22, which typically include a receiver and transmitter (except in certain pager applications) for providing wireless communications with other terminals or telephoning systems directly or through ground or satellite base stations. In telephone embodiments, the radio communication electronics are typically associated with a microphone 24 for receiving audible voice signals and a speaker 26 to acoustically reproduce audible signals for the terminal's user. The radio communication electronics 22 are associated with one or more antennas 30.

Preferably, the amplifier and matching circuitry for the present invention is configured to operate on cellular signals in the Global System for Mobile (GSM) communications. GSM is a digital cellular radio network that allows one network channel to support multiple conversations by means of time division multiple access (TDMA). TDMA takes one network channel and divides it into slices of time. The mobile terminal user is given one of these slices of time for a brief, pre-scheduled interval. The interval is short enough that neither the mobile user nor other mobile users on the same radio channel notice that they are only transmitting or receiving on a fraction of the channel. In this manner, the capacity of the network is significantly increased over standard analog cellular, which requires an entire channel for transmission.

GSM technology is used on several different radio frequency bands. The original GSM standard was designed for use on the 900 MHz radio band. Additional bands, using lower radio transmitter power at the base stations and the mobile terminals, followed. These lower-powered systems are generally referred to as digital communication systems (DCS). Thus, technically DCS is a form of GSM communications. DCS systems typically operate on an 1800 MHz band. For the purpose of discussing the preferred embodiments, the original 900 MHz GSM standard is simply referred to as GSM, and the 1800 MHz variation is generally referred to as DCS. Notably, this configuration is used only for the purpose of describing the preferred embodiment. Those skilled in the art will recognize the invention is applicable with various combinations of frequencies.

The GSM and DCS communication standard use the same base band signals, but operate on different carrier frequencies. Thus, a mobile terminal configured to operate in GSM and DCS modes is typically configured to operate on the same base band signals and modulate these base band signals at different carrier frequencies, depending on the desired communication mode—GSM or DCS.

Figure 2:
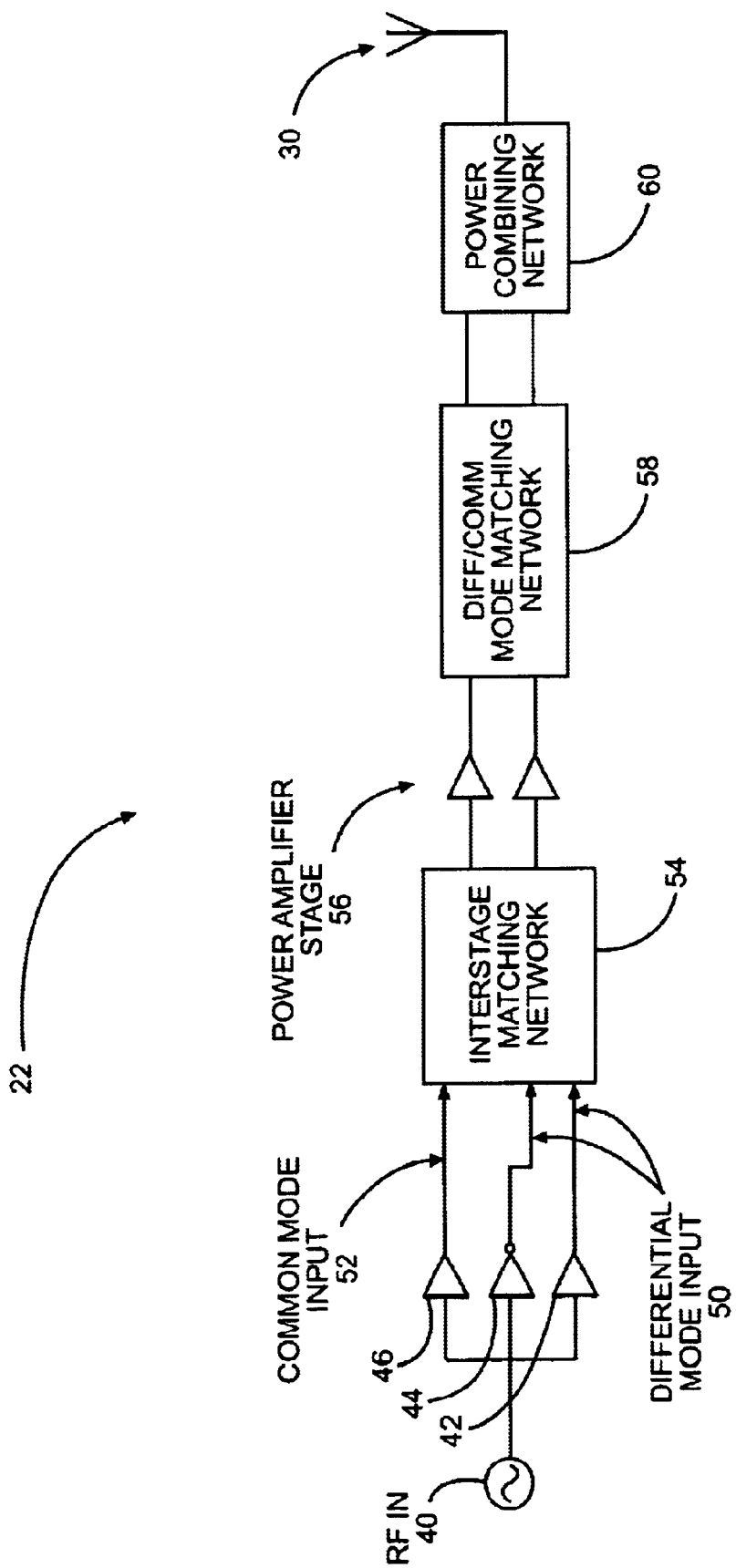
FIG. 2 is a block schematic of a transmission path incorporating amplifiers and matching networks according to one embodiment of the present invention.

A basic overview of the communication electronics 22 and, in particular, the transmission circuitry of the present invention is shown in FIG. 2. An RF input 40 provides either a GSM signal operating between about 880 and 920 MHz or a DCS signal operating between about 1710 and 1785 MHz. The signal, whether GSM or DCS, is sent to a first amplifier stage having amplifier networks 42, 44, and 46. If the signal is a GSM signal, amplifier network 46 amplifies the signal and sends the signal to an interstage matching network 54. If the RF input is a DCS signal, amplifier network 42 amplifies the DCS signal and sends the signal to the interstage matching network 54. Additionally, amplifier network 44 will invert or provide 180° phase shift to the DCS signal, amplify it, and send it to the interstage matching network 54.

The interstage matching network 54 provides an impedance match between the initial amplifier sections 42, 44, and 46, and the amplifiers in a subsequent power amplifier stage 56. The interstage matching network 54 receives the amplified GSM signal from amplifier network 46, splits the signal into two identical GSM signals, and sends the duplicate GSM signals to the power amplifier stage 56. If the RF input is a DCS signal, the interstage matching network 54 receives an amplified DCS signal from amplifier network 42 and an inverted DCS signal (DCS') from amplifier network 44. The interstage matching network is configured to send the respective DCS and DCS' signals to the two amplifier networks in power amplifier stage 56. Notably, these are the same amplifier networks that receive the two identical GSM signals. In this configuration, the output of amplifier network 46 is referred to as a common mode input 52, and the respective outputs of amplifier networks 42 and 44 are referred to as a differential mode input 50 to the interstage matching network.

The respective outputs of the power amplifier stage 56 electrically communicate with a differential/common mode matching network 58. This network is configured to provide impedance matching using a passive network for the 900 MHz GSM signals and the 1750 MHz DCS signals, even though the signals are almost one octave apart in the preferred embodiment. The output of the differential/common mode matching network 58 is coupled to a power-combining network, which is further coupled to the antenna 30. The power-combining network 60 is required to combine the two signals, whether common mode GSM or differential mode DCS, into one signal for transmission. Further detail of the transmission circuitry is provided below.

Figure 3:
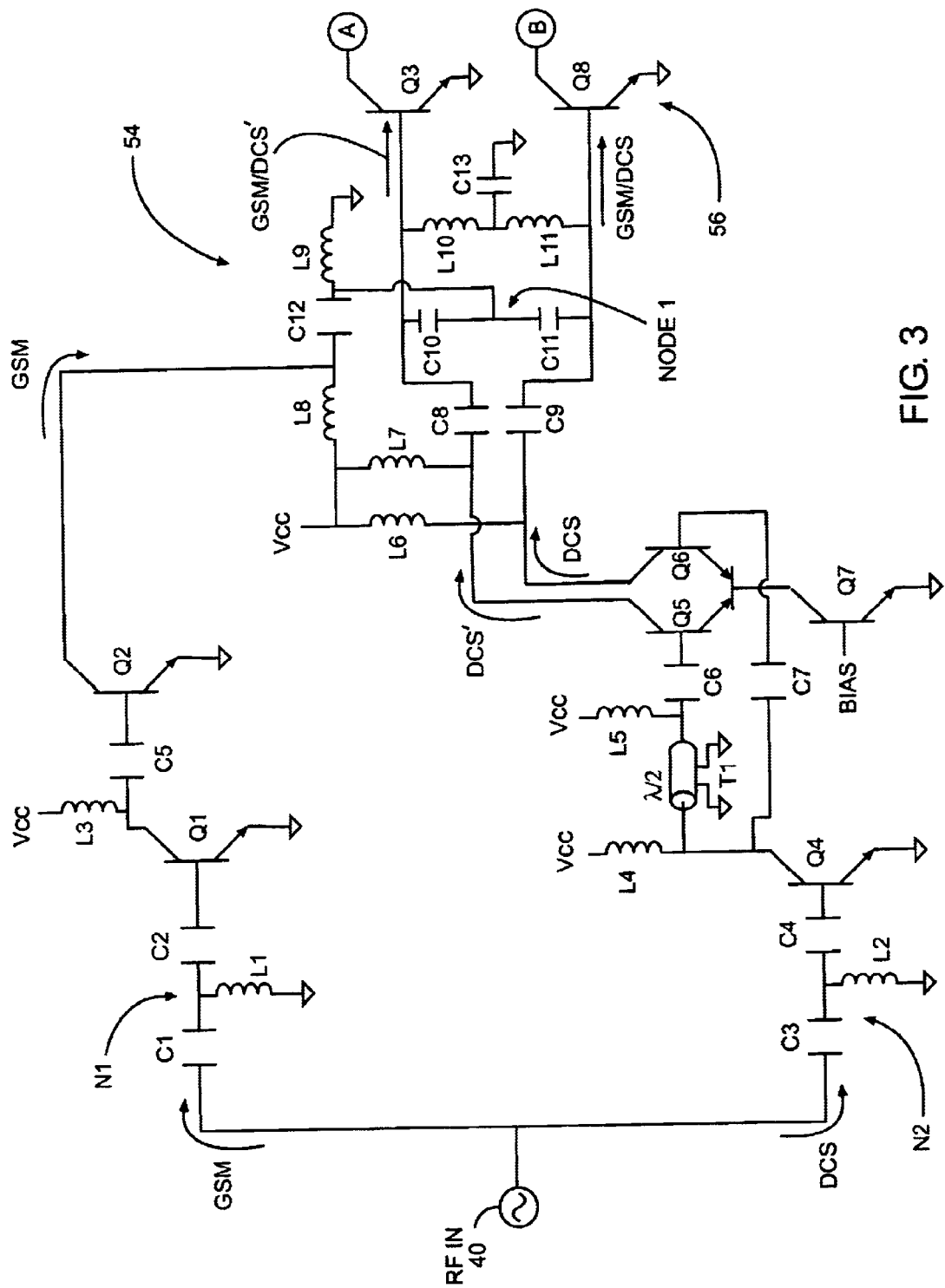
FIG. 3 is a schematic representation of a dual mode amplifier according to one embodiment of the present invention.

FIG. 3 is a basic schematic representation of the amplifier sections 42, 44, and 46, interstage matching network 54, and the power amplifier stage 56. If the RF input 40 is a GSM signal, the bias supply to the base of Q4 is turned off. The DCS input matching network N2 in conjunction with the input impedance of unbiased transistor Q4 provide an impedance in parallel with the impedance of the RF input 40 source. The GSM matching network N1 thus matches this combined impedance to the base of Q2. The transmission path flows through a first matching network N1, which is a high pass filter formed by capacitors C1 and C2, an inductor L1. The output of network N1 feeds a transistor amplifier network formed from transistors Q1 and Q2, capacitor C5, and inductor L3. The amplified GSM signal is then sent to the interstage matching network 54.

The GSM signal passes through another high-pass filter formed by capacitor C12 and L9 to Node 1 of the network, where the GSM signal is split in two. Inductor L8 provides Vcc bias current to the collector of Q2. C12 provides impedance matching and DC blocking for the Vcc bias supply. At Node 1, the GSM signal is sent through both capacitors C10 and C11 and onto power amplifier stage 56 formed by transistor networks Q3 and Q8. Notably, when the RF input signal 40 is a GSM signal, the signals amplified by transistor networks Q3 and Q8 are preferably of the same amplitude and phase.

If the RF input signal 40 is a DCS signal, the transmission path includes matching network N2, which likewise compensates for the impedance of network N1 and unbiased transistor Q1. Network N2 is a high-pass filter formed by capacitors C3, C4 and inductor L2. As noted above, the DCS signal is split into two signals wherein resulting signals are 180° out-of-phase from one another. This task is accomplished by using a transistor network formed by transistor Q4 and inductor L4 to drive two inputs of a differential amplifier network formed by transistors Q5 and Q6. Transistor network Q4 amplifies the DCS signal and drives transistor network Q6 through capacitor C7 and transistor network Q5 through a transmission line T1 and a capacitor C6. The capacitor C6 and L5 match the input impedance of Q5 to the impedance of transmission line T1. Likewise C7 and L4 match the input impedance of Q6 to the impedance of the transmission line T1. The impedance seen by the collector of Q4 is thus half the transmission line T1 impedance.

The transmission line T1 is configured to have an effective electrical length of one-half the wavelength of the DCS signal, $\lambda/2$. This configuration will effectively provide a signal 180° out-of-phase from the original DCS signal to drive transistor network Q5. Thus, the output of transistor network Q5 is the inverted DCS signal, referred to as DCS', and the output of transistor network Q6 is the amplified DCS signal. The transistor networks Q5 and Q6 are biased using a transistor network Q7 and are coupled to a power supply through inductors L7 and L6, respectively.

The amplified DCS signal from transistor network Q6 passes through capacitor C9 and onto transistor network Q8 of the power amplifier stage 56. Likewise, the amplified DCS' signal from transistor network Q5 passes through capacitor C8 and onto transistor network Q3 of power amplifier stage 56.

The network formed by capacitors C10, C11 and C12 and inductors L8 and L9, and the network formed by inductors L10 and L11 and capacitor C13 provide impedance matching for common mode signals. The effects of these networks are reduced to a shunt capacitance from C10 and C11 and a shunt inductance from L10 and L11 which provide impedance matching for the differential mode DCS signals. The latter is caused because the junction of C10 and C11 and the junction of L10 and L11 are a virtual ground when the signals along the transmission paths are opposite in phase and identical in magnitude.

Figure 4:
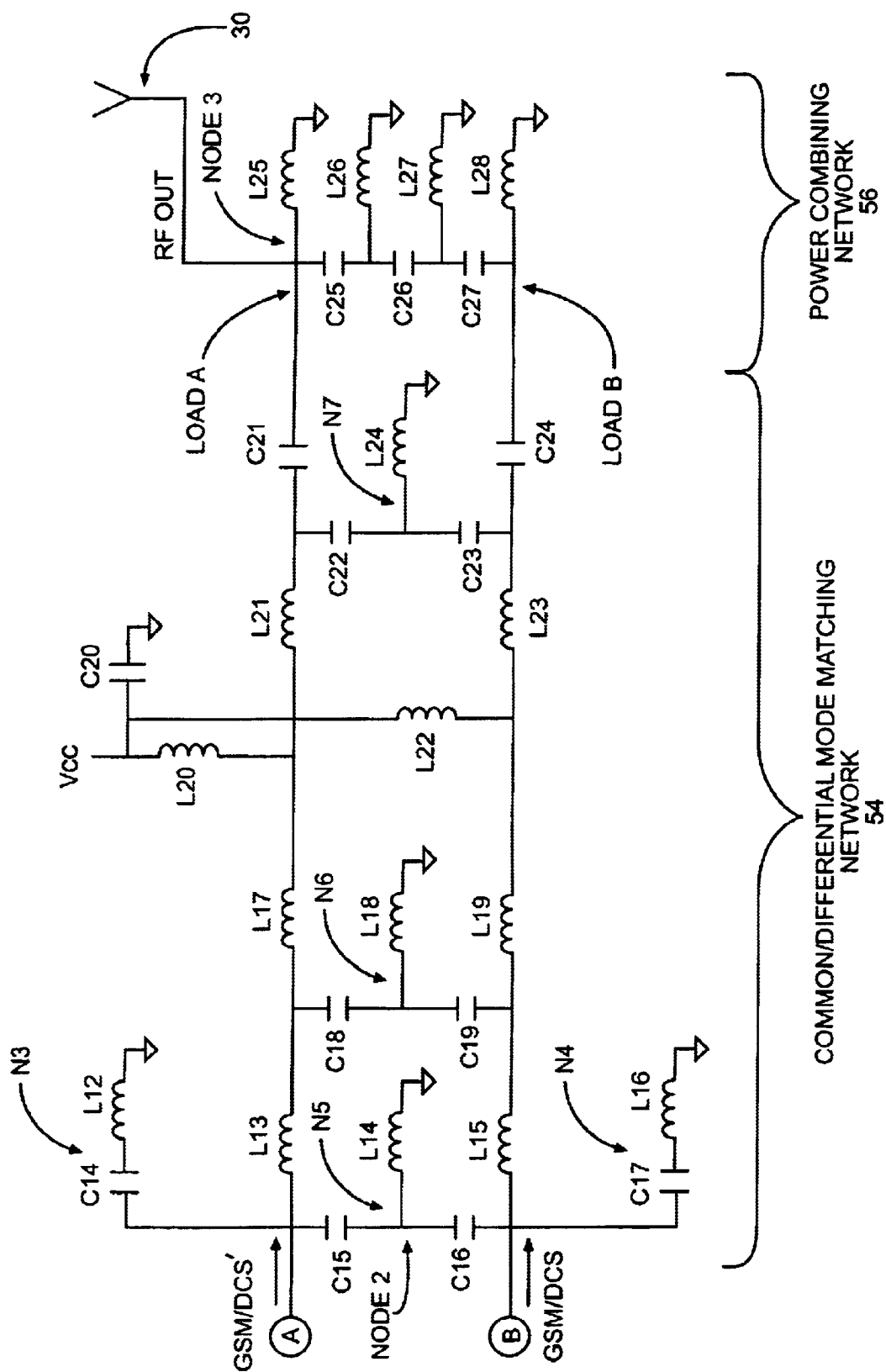
FIG. 4 is a schematic representation of a common/differential mode matching network and associated power combining network according to one embodiment of the present invention.

With reference now to FIG. 4, the common/differential mode matching network 54 and power combining network 56 are shown in detail. The input impedance between points A and B of the common/differential mode matching network 54 is preferably four ohms differentially between point A and point B, and two ohms between each point and ground. The output impedance between load A and ground and load B and ground is preferably 100 ohms.

In DCS, or differential mode operation, identical, yet out-of-phase, signals are provided at input points A and B. Assuming the DCS signals are operating about 1750 MHz, network N3, formed by capacitor C14 and inductor L12, and network N4, formed by capacitors C17, and inductor L16 are each configured to form a series resonant circuits at the second harmonic of the DCS signal. If the DCS signal is 1750 MHz, the series resonant circuits of networks N3 and N4 are configured to provide a short to ground for signals about 3.5 gigahertz (GHz), which is the second harmonic of a 1750 MHz signal.

Further, network N5 is formed by capacitor C15, capacitor C16, and inductor L14. Since the DCS signals at input points A and B are 180° out-of-phase from each other, the voltage at point A is going up as the voltage at point B is coming down and vice versa. The symmetry of the matching network 54 in this differential mode places a pseudo-ground at the junctions of capacitors C15 and C16 of network N5; capacitors C18 and C19 of network N6; and capacitors C22 and C23 of network N7. As such, inductor L14 of network N5; inductor L18 of network N6; and inductor L24 of network N7 do not have current flowing through them and are effectively removed from the circuit. Preferably, C15 and C16 of network N5 are used for capacitive loading between input points A and B and are compensated for by the remainder of the network. Given the pseudo-grounds formed in networks N5, N6, and N7, the matching network 54 forms a classic low-pass impedance transformation from 100 ohms to ground at load A and load B to a differential four ohms and two ohms to ground at points A and B. The low-pass filter is formed using the capacitive elements in networks N5, N6, and N7 in association with the inductors L13, L17, and L21 along the transmission path between input A and load A, as well as inductors L15, L19, and L23 along the transmission path between input B and load B. Capacitors C21 and C24 provide further compensation for the impedance transformation and DC blocking.

In GSM operation, signals having the same amplitude and phase are provided at input points A and B. The signals preferably operate at about 900 MHz. At these frequencies, networks N3 and N4, which are series resonant circuits at 3.5 GHz, provide only a small amount of shunt capacitance which is compensated by the remaining network. At the lower GSM frequencies, networks N5, N6, and N7 are of primary importance. Thus, network N5 essentially provides a series resonant circuit to ground. Preferably the network N5 is configured to resonate at the second harmonic of the GSM frequency—1.8 GHz. Since the GSM signals are identically applied to both inputs, there is no pseudo-ground at Node 2. Capacitors C15 and C16 are effectively in parallel with one another and are in series with inductor L14. Thus, network N5 essentially forms a series resonant circuit to ground from input A and input B.

Networks N6 and N7 are configured to provide tuning for the effective impedance transformation of the entire network. The role of inductor L18 of network N6 is to modify the reactance of the parallel combination of capacitors C18 and C19 which are in series with L18 during common mode operation. Likewise, L24 of network N7 changes the effective reactance of the parallel combination of capacitors C22 and C23. This tunes the overall network for the proper impedance transformation in the common mode operation for the GSM band. In common mode operation, the network 54 also forms a classic low-pass impedance transformation from 100 ohms to ground at load A and load B to a common mode one ohm impedance to ground at shorted input points A and B or two ohms to ground at input A and input B.

Typically, the power delivered to the 100 ohm impedances at load A and load B must be combined and delivered to a common 50 ohm load for transmission through antenna 30. At load A and B, the DCS signals are 180° out-of-phase while the GSM signals are in phase. For proper power combining, a section of 100 ohm transmission line T2 and T3 (160 psec delay) needs to be inserted at the load A and load B points before the signals enter the power combining network 56. The purpose of this line is seen by following the signal flow from load B through the power combining network to node 3. Without T2 and T3, as the signal from load B arrives at node 3, it sees a 50 ohm impedance looking out toward the antenna 30 and a low impedance looking back through the matching network toward point A. The section of transmission line transforms the impedance looking back toward A to a higher impedance. Now the energy entering node 2 from load B sees the 50 ohm impedance from the RF out to the antenna 30 in parallel with a high impedance looking back toward point A. The majority of energy flow is thus toward the antenna 30.

FIG. 4 illustrates an implementation of a lumped-element, high pass transmission line. This 100 ohm transmission line provides almost 360° of phase shift at the low frequency GSM band, and 180° of phase shift at the DCS band. Thus, the signals at Node 3 are in phase for both frequency bands and modes of operation. The power combining network 56 also provides harmonic cancellation. For example, in GSM modes, signal harmonics generated at each of the output devices are in phase. When these harmonics are combined at Node 3, one set will have passed through the lumped-transmission line and receive a 180° phase shift. When the second harmonics from the two-signal pass are added, they will cancel.

The following is a list of component values for the preferred, common/differential mode matching network 54 described above.

| Component Values For The Matching Network Of FIG. 4 | | | |
|---|---|---|---|
| C14 | 2.5 pF | L12 | 0.83 nH |
| C15 | 4 pF | L13 | 0.6 nH |
| C16 | 2.5 pF | L14 | 0.98 nH |
| C17 | 8.1 pF | L15 | 0.6 nH |
| C18 | 8.1 pF | L16 | 0.83 nH |
| C19 | 1 nF | L17 | 1.6 nH |
| C20 | 4.5 pF | L18 | 0.6 nH |
| C21 | 2.6 pF | L19 | 1.6 nH |
| C22 | 2.6 pF | L20 | 8 nH |
| C23 | 4.5 pF | L21 | 8 nH |
| C24 | 4.5 pF | L22 | 1.8 nH |
| C25 | 1.32 pF | L23 | 1.8 nH |
| C26 | 1.32 pF | L24 | 1.5 nH |
| C27 | 1.32 pF | L25 | 15.2 nH |
| | | L26 | 7.6 nH |
| | | L27 | 7.6 nH |
| | | L28 | 15.2 nH |

In the above disclosure, the transistor amplifier network and the associated passive components depicted in the several drawing figures, are meant to represent any number of amplifier configurations. For example, any one transistor depicted in the drawing figure may actually include multiple transistors of multiple types. For example, these transistors may be bi-polar transistors and, in particular, heterojunction bi-polar transistors using Gallium arsenide technology. Alternatively, these transistor amplifiers may include any one of the multitude of field-effect transistors (FET) alone or in combination with other bi-polar or FET devices. Those skilled in the art will quickly recognize the multitude of amplifier configurations compatible with the present invention.

Certain modifications and improvements will occur to those skilled in the art upon reading the foregoing description. For example, those skilled in the art will recognize that network N5 in FIG. 4 would not be required for a common frequency implementation of the present invention. When the novel matching network is used for multiple modes of operation at a single frequency, networks N3 and N4 would provide the requisite second harmonic short for common or differential modes. Although the foregoing embodiments of the present invention have been described in association with various elements, i.e. inductors, it shall be understood that such inductors also include classic coils, bond wires or even a section of transmission line, among other inductive devices. Furthermore, the various embodiments of the invention described herein above are suitable for use with signal frequencies ranging from audio frequencies up through millimeter wave frequencies, i.e. DC through almost light. It shall also be understood that all such modifications and improvements have been amended for the sake of conciseness and readability, but are properly within the scope of the following claims.

What is claimed is:

1. A matching network for dual mode radio frequency (RF) power amplifier circuitry wherein an RF input signal is split into either two identical signals in a common mode or two signals 180 degrees out-of-phase from one another in a differential mode, said matching network comprising:

a. a first transmission path extending between a first input and a first output, said first input for receiving one common mode signal or one differential mode signal;

b. a second transmission path extending between a second input and a second output; said second input for receiving one common mode signal or one differential mode signal;

c. a first passive network to ground from said first and second transmission paths resonating at about a second harmonic frequency of the common mode RF signal when said common mode RF signal is applied to said first and second inputs;

d. a second passive network to ground from said first and second transmission paths resonating at about a second harmonic frequency of the differential mode RF signal when said differential mode RF signal is applied to one said input and 180 degrees out-of-phase to the other said input; and e. a third passive network cooperating with said first and second networks to provide a select input impedance and a select output impedance at either common mode or differential mode signals;

f. wherein said network provides a select input and output impedance and is configured to terminate second harmonics for a given frequency in differential or common mode operation.

2. The network as claimed in claim 1 wherein said first passive network includes an inductor coupled to ground, a first capacitor coupled between said inductor and said first transmission path and a second capacitor coupled between said inductor and said second transmission path.

3. The network as claimed in claim 1 wherein said second passive network includes a first series resonant circuit coupled between ground and said first transmission path and a second series resonant circuit coupled between ground and said second transmission path, each said resonant circuit resonating at a second harmonic of the differential mode RF signal.

4. The network as claimed in claim 3 wherein said first and second series resonant circuits include a series capacitor and an inductive device.

5. The network as claimed in claim 1 wherein said third passive network includes an inductor coupled to ground, a first capacitor coupled between said inductor and said first transmission path and a second capacitor coupled between said inductor and said second transmission path.

6. The network as claimed in claim 1 wherein said third passive network includes a first capacitor coupled to ground, a second capacitor coupled between said first capacitor and said first transmission path and a third capacitor coupled between said first capacitor and said second transmission path.

7. The network as claimed in claim 1 wherein
   a. said first passive network includes a first inductor coupled to ground, a first capacitor coupled between said first inductor and said first transmission path and a second capacitor coupled between said first inductor and said second transmission path, and
   b. said second passive network includes a first series resonant circuit coupled between ground and said first transmission path and a second series resonant circuit coupled between ground and said second transmission path, each said resonant circuit resonating at a second harmonic of the differential mode RF signal.

8. The network as claimed in claim 7 wherein said third passive network includes a second inductor coupled to ground, a third capacitor coupled between said second inductor and said first transmission path and a fourth capacitor coupled between said second inductor and said second transmission path.

9. The network as claimed in claim 7 wherein said third passive network includes a third capacitor coupled to ground, a fourth capacitor coupled between said third capacitor and said first transmission path and a fifth capacitor coupled between said third capacitor and said second transmission path.

10. The network as claimed in claim 7 wherein said first and second series resonant circuits include a series capacitor and inductor.

11. The network as claimed in claim 1 wherein said differential mode RF signal frequency is about an octave apart from said common mode RF signal frequency.

12. The network as claimed in claim 1 wherein said common mode RF signal frequency is about 900 MHz.

13. The network as claimed in claim 1 wherein said common mode RF signal frequency is an audio frequency.

14. The network as claimed in claim 1 wherein said common mode RF signal frequency is a millimeter wave frequency.

15. The network as claimed in claim 1 wherein said common mode RF signal frequency is between an audio frequency and a millimeter wave frequency.

16. The network as claimed in claim 1 wherein said differential mode RF signal frequency is about 1750 MHz.

17. The network as claimed in claim 1 wherein said differential mode RF signal frequency is an audio frequency.

18. The network as claimed in claim 1 wherein said differential mode RF signal frequency is a millimeter wave frequency.

19. The network as claimed in claim 1 wherein said differential mode RF signal frequency is between an audio frequency and a millimeter wave frequency.

20. The network as claimed in claim 1 wherein said common mode RF signal is a GSM signal and said differential RF signal is a DCS signal.

21. The network as claimed in claim 1 wherein said differential mode RF signal frequency is about the second harmonic of said common mode RF signal frequency.

22. A matching network and dual mode radio frequency (RF) amplifier circuitry comprising:
   a. a first stage configured to receive an RF input signal and split it into either two identical signals in a common mode or two signals 180 degrees out-of-phase from one another in a differential mode;
   b. a second stage having power amplifier circuitry to amplify said RF signals;
   c. a matching network comprising:
      i. a first transmission path extending between a first input and a first output, said first input for receiving one common mode signal or one differential mode signal;
      ii. a second transmission path extending between a second input and a second output; said second input for receiving one common mode signal or one differential mode signal;
      iii. a first passive network to ground from said first and second transmission paths resonating at about a second harmonic frequency of the common mode RF signal when said common mode RF signal is applied to said first and second inputs;
      iv. a second passive network to ground from said first and second transmission paths resonating at about a second harmonic frequency of the differential mode RF signal when said differential mode RF signal is applied to one said input and 180 degrees out-of-phase to the other said input; and
      v. a third passive network cooperating with said first and second networks to provide a select input impedance and a select output impedance at either common mode or differential mode signals, wherein said network provides a select input and output impedance and is configured to terminate second harmonics for a given frequency in differential or common mode operation;
   d. a third stage comprising power combining circuitry configured to combine RF signals at said first and second outputs for transmission via an antenna.

23. The matching network and dual mode radio frequency amplifier circuitry of claim 22 wherein said power combining circuitry is a lumped element high-pass transmission line and is configured to receive the two GSM signals or the out-of-phase DCS signals at said outputs in and sum the two GSM signals or the two DCS signals in-phase with one another.

24. The matching network and dual mode radio frequency amplifier circuitry of claim 23 wherein said power combining circuitry is configured to shift the phase of one of the GSM signals 360 degrees before combining the GSM signals and shift the phase of one of the DCS signals 180 degrees before combining the DCS signals.

25. The network as claimed in claim 22 wherein said first passive network includes an inductor coupled to ground, a first capacitor coupled between said inductor and said first transmission path and a second capacitor coupled between said inductor and said second transmission path.

26. The network as claimed in claim 22 wherein said second passive network includes a first series resonant circuit coupled between ground and said first transmission path and a second series resonant circuit coupled between ground and said second transmission path, each said resonant circuit resonating at a second harmonic of the differential mode RF signal.

27. The network as claimed in claim 22 wherein said third passive network includes an inductor coupled to ground, a first capacitor coupled between said first inductor and said first transmission path and a second capacitor coupled between said first inductor and said second transmission path.

28. The network as claimed in claim 22 wherein said third passive network includes a first capacitor coupled to ground, a second capacitor coupled between said first capacitor and said first transmission path and a third capacitor coupled between said first capacitor and said second transmission path.

29. The network as claimed in claim 22 wherein said differential mode RF signal frequency is about an octave apart from said common mode RF signal frequency.

30. The network as claimed in claim 22 wherein said common mode RF signal frequency is about 900 MHz.

31. The network as claimed in claim 22 wherein said differential mode RF signal frequency is about 1750 MHz.

32. The network as claimed in claim 22 wherein said common mode RF signal is a GSM signal and said differential RF signal is a DCS signal.

33. The network as claimed in claim 22 wherein said differential mode RF signal frequency is about the second harmonic of said common mode RF signal frequency.

34. A matching network for a radio frequency transmission circuitry comprising:
   a. two parallel transmission paths configured to receive two identical signals about a first frequency that are in-phase with one another during operation in a first mode and two identical signals about a second frequency that are 180 degrees out-of-phase with one another during operation in a second mode;
   b. first passive circuit means for shorting frequencies about a second harmonic frequency of the first frequency to ground from said transmission paths when operating in said first mode;
   c. second passive circuit means for shorting frequencies about a second harmonic frequency of the second frequency to ground from said transmission paths when operating in said second mode; and
   d. third passive circuit means cooperating with said first and second circuit means for providing a select input impedance and a select output impedance at either the first or second mode wherein said network provides a select input and output impedance and is configured to terminate second harmonics for a given frequency in either mode of operation.

35. The network as claimed in claim 34 wherein the frequency for said second mode of operation is about the second harmonic of said frequency for said first mode of operation.

36. A dual mode radio frequency power amplifier matching network comprising:
   a. a first transmission path extending between a first input and a first output, the first input configured to receive a radio frequency signal of a type selected from the group consisting of common mode and differential mode;
   b. a second transmission path extending between a second input and a second output, the second input configured to receive a radio frequency signal of a type selected from the group consisting of common mode and differential mode;
   c. a first passive network to ground from the first and second transmission paths resonating at about a second harmonic frequency of a differential mode radio frequency signal for a differential mode radio frequency signal applied to the first input and further applied 180 degrees out-of-phase to the second input, the first passive network further resonating at about a second harmonic frequency of a common mode radio frequency signal for a common mode radio frequency signal applied to the first and second inputs; and
   d. a second passive network cooperating with the first passive network to provide a select input impedance and a select output impedance for a radio frequency input signal of a type selected from the group consisting of common mode and differential mode.

37. The network as claimed in claim 36 wherein the first passive network includes a first series resonant circuit coupled between ground and the first transmission path and a second series resonant circuit coupled between ground and the second transmission path.

38. The network as claimed in claim 37 wherein the first and second series resonant circuits include a series capacitor and inductive device.

39. The network as claimed in claim 36 wherein the second passive network includes an inductor coupled to ground, a first capacitor coupled between the inductor and the first transmission path, and a second capacitor coupled between the inductor and the second transmission path.

* * * * *